US010096753B2

(12) United States Patent
Okahisa et al.

(10) Patent No.: US 10,096,753 B2
(45) Date of Patent: Oct. 9, 2018

(54) LIGHT EMITTING DEVICE

(71) Applicant: NICHIA CORPORATION, Tokushima (JP)

(72) Inventors: Tsuyoshi Okahisa, Tokushima (JP); Yuta Oka, Tokushima (JP); Daisuke Sanga, Tokushima (JP)

(73) Assignee: NICHIA CORPORATION, Anan-Shi, Tokushima (JP)

( * ) Notice: Subject to any disclaimer, the term of this patent is extended or adjusted under 35 U.S.C. 154(b) by 0 days.

(21) Appl. No.: 14/452,827

(22) Filed: Aug. 6, 2014

(65) Prior Publication Data

US 2015/0041844 A1    Feb. 12, 2015

(30) Foreign Application Priority Data

Aug. 7, 2013  (JP) .................................. 2013-164212

(51) Int. Cl.
*H01L 33/54*    (2010.01)
(52) U.S. Cl.
CPC .................... *H01L 33/54* (2013.01)
(58) Field of Classification Search
CPC ......... H01L 33/54; H01L 33/56; H01L 33/00; H01L 33/10; H01L 33/20; H01L 33/26; H01L 33/36; H01L 33/40; H01L 33/42; H01L 33/44; H01L 33/48; G02B 19/0066
USPC ..................................................... 257/79, 98
See application file for complete search history.

(56) References Cited

U.S. PATENT DOCUMENTS

| 6,083,769 A * | 7/2000 | Kurahashi ........................ 438/33 |
| 2006/0050526 A1* | 3/2006 | Ikeda ...................... H01L 33/54 362/555 |
| 2006/0102914 A1 | 5/2006 | Smits et al. |
| 2006/0105484 A1 | 5/2006 | Basin et al. |

(Continued)

FOREIGN PATENT DOCUMENTS

| JP | S50-008494 | 1/1975 |
| JP | 2005-109289 A | 4/2005 |

(Continued)

OTHER PUBLICATIONS

Japanase Office Action dated Apr. 25, 2017, issued in corresponding JP Application No. 2013-164212.

*Primary Examiner* — Daniel Whalen
*Assistant Examiner* — Suberr Chi
(74) *Attorney, Agent, or Firm* — Squire Patton Boggs (US) LLP

(57) ABSTRACT

A light emitting device has a lens, extended to outside of the mounting substrate on which a semiconductor a light emitting element is mounted, and leakage of light is reduced. A light emitting element, a substrate having the light emitting element mounted on its upper surface, and a lens, having a curved upper surface encloses the light emitting element and the upper surface of the substrate is included. From the bottom surface of the lens, a lower surface of the substrate is exposed. In a top view from a perpendicular direction to the upper surface of the substrate, the bottom surface of the lens includes an outer extending portion where the bottom surface is extended to outside of the substrate, and a inclined portion, which inclines with respect to a direction approximately in parallel to the upper surface of the substrate, at an end portion of the outer extending portion.

12 Claims, 10 Drawing Sheets

(56) References Cited

U.S. PATENT DOCUMENTS

| | | |
|---|---|---|
| 2006/0105485 A1 | 5/2006 | Basin et al. |
| 2006/0152820 A1* | 7/2006 | Lien .......................... F21V 5/04 |
| | | 359/726 |
| 2008/0048200 A1 | 2/2008 | Mueller et al. |
| 2008/0136326 A1 | 6/2008 | Nakamura et al. |
| 2008/0157114 A1 | 7/2008 | Basin et al. |
| 2009/0072265 A1 | 3/2009 | Nakamura et al. |
| 2010/0230791 A1* | 9/2010 | Tran et al. .................... 257/675 |
| 2011/0057205 A1 | 3/2011 | Mueller et al. |
| 2011/0057226 A1* | 3/2011 | Oberleither et al. ........... 257/98 |
| 2011/0140145 A1* | 6/2011 | Chen .......................... F21V 5/04 |
| | | 257/98 |
| 2013/0063024 A1 | 3/2013 | Wada et al. |

FOREIGN PATENT DOCUMENTS

| | | |
|---|---|---|
| JP | 2007-080884 A | 3/2007 |
| JP | 2007-103818 A | 4/2007 |
| JP | 2007-148332 A | 6/2007 |
| JP | 2007-150232 A | 6/2007 |
| JP | 2007-317952 A | 12/2007 |
| JP | 2008-277592 A | 11/2008 |
| JP | 2009-182085 A | 8/2009 |
| JP | 2010-085493 A | 4/2010 |
| JP | 2010-238846 A | 10/2010 |
| JP | 2010-251666 A | 11/2010 |
| JP | 2011-138815 A | 7/2011 |
| JP | 2013-077798 A | 4/2013 |
| JP | 2013-138132 A | 7/2013 |
| JP | 2013-229397 A | 11/2013 |
| WO | 2007/135754 A1 | 11/2007 |
| WO | 2011/065322 A1 | 6/2011 |

\* cited by examiner

[Fig. 1A]
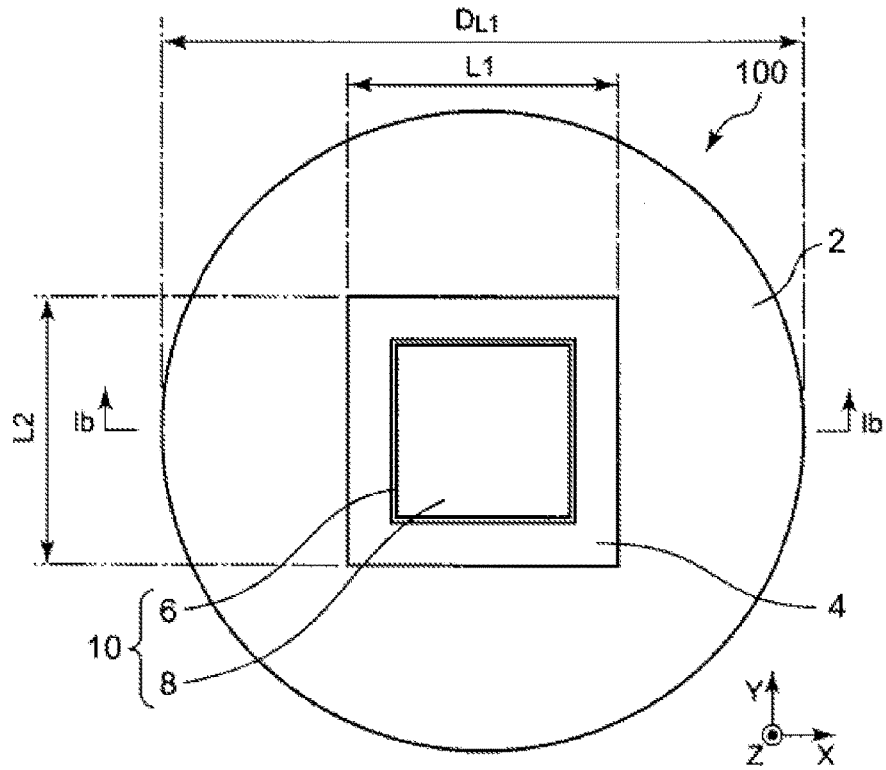
[Fig. 1B]
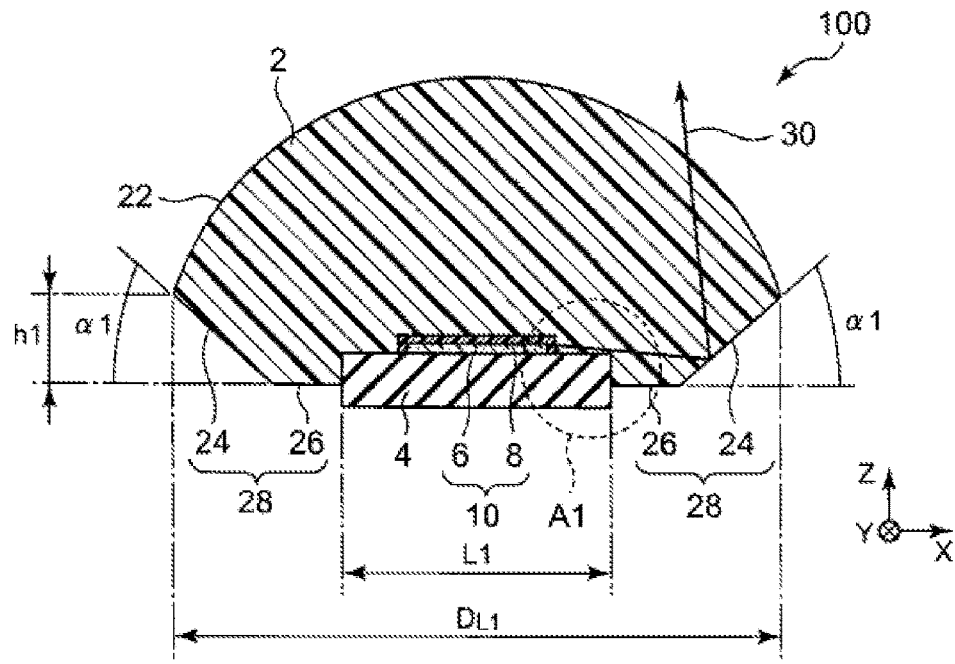

[Fig. 2]
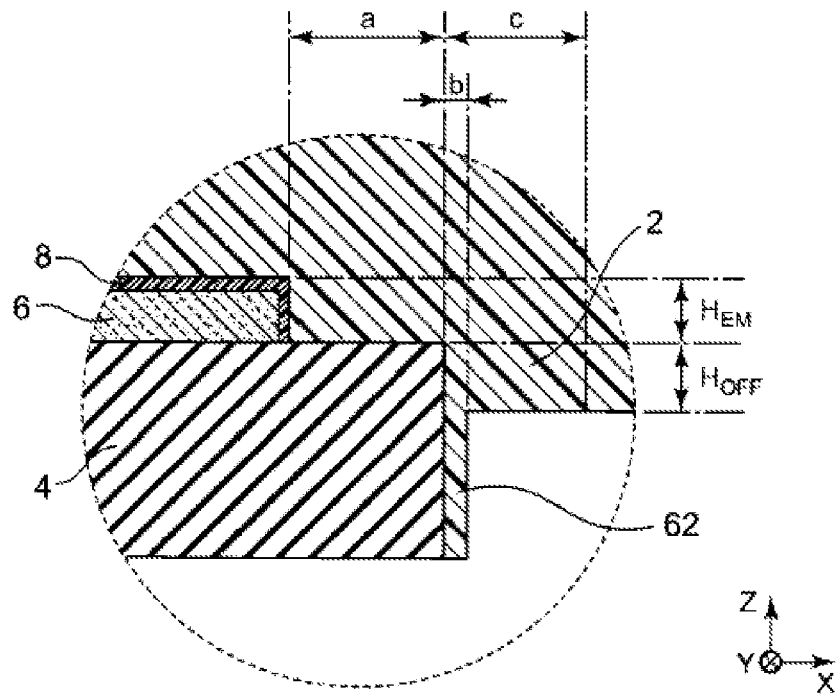
[Fig. 3]
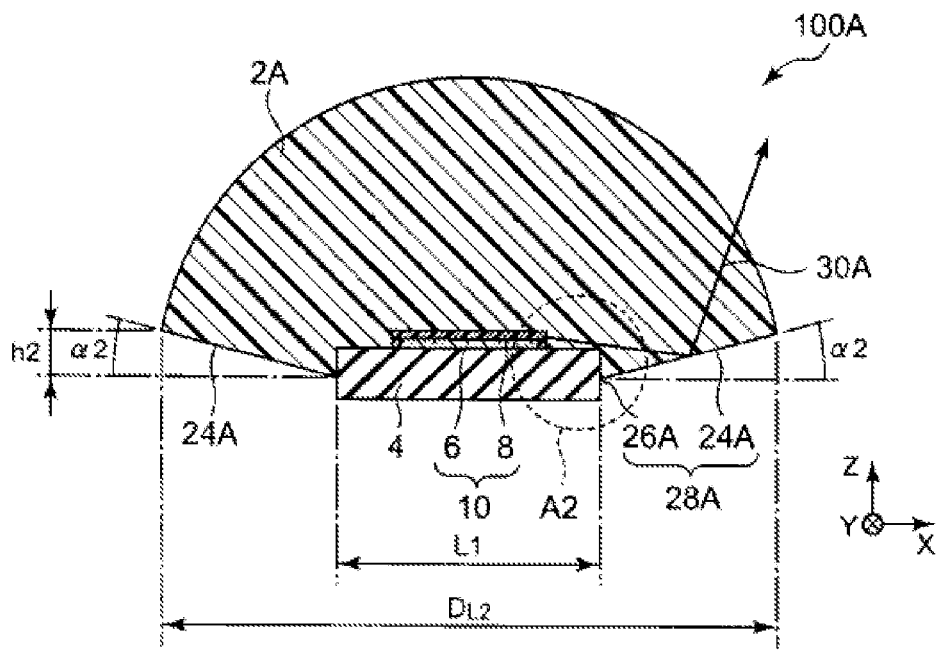

[Fig. 4]
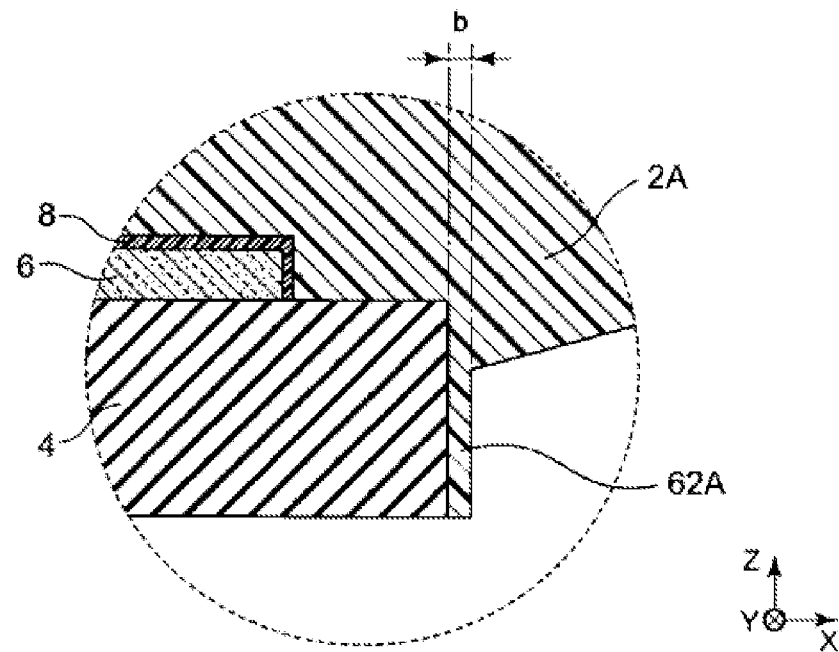
[Fig. 5]
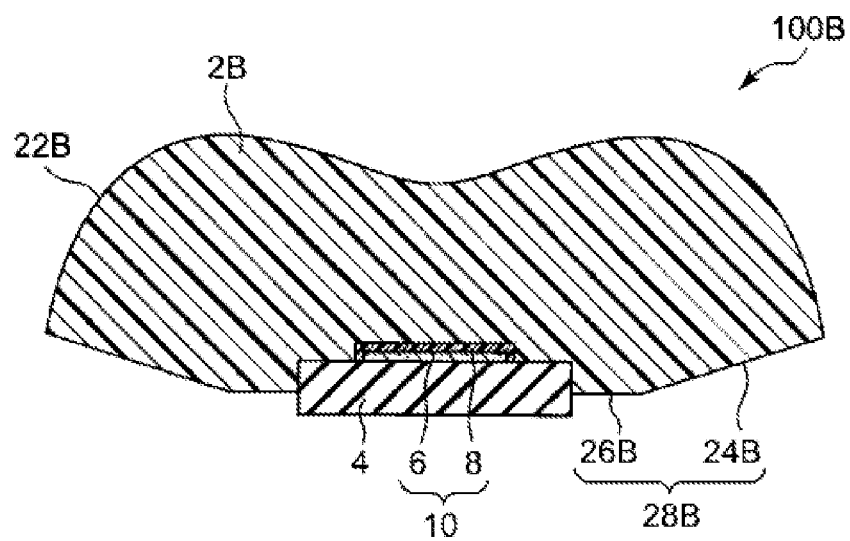

[Fig. 6]
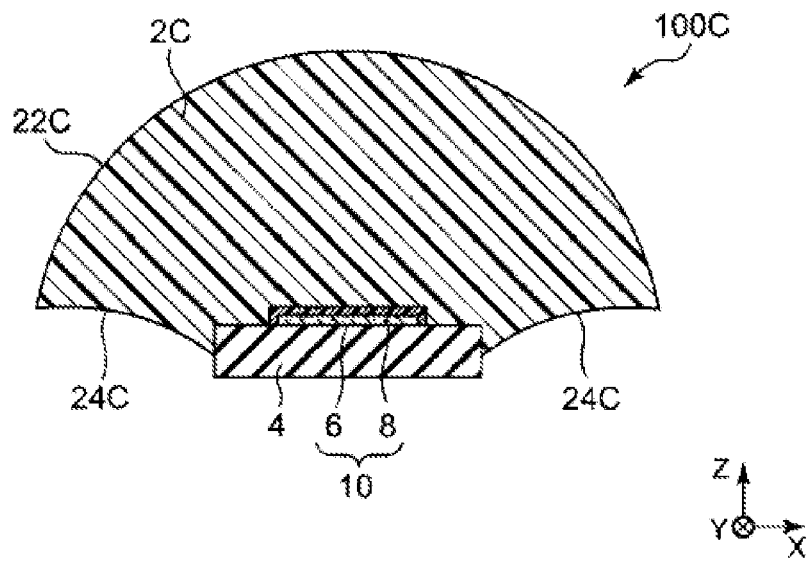
[Fig. 7]
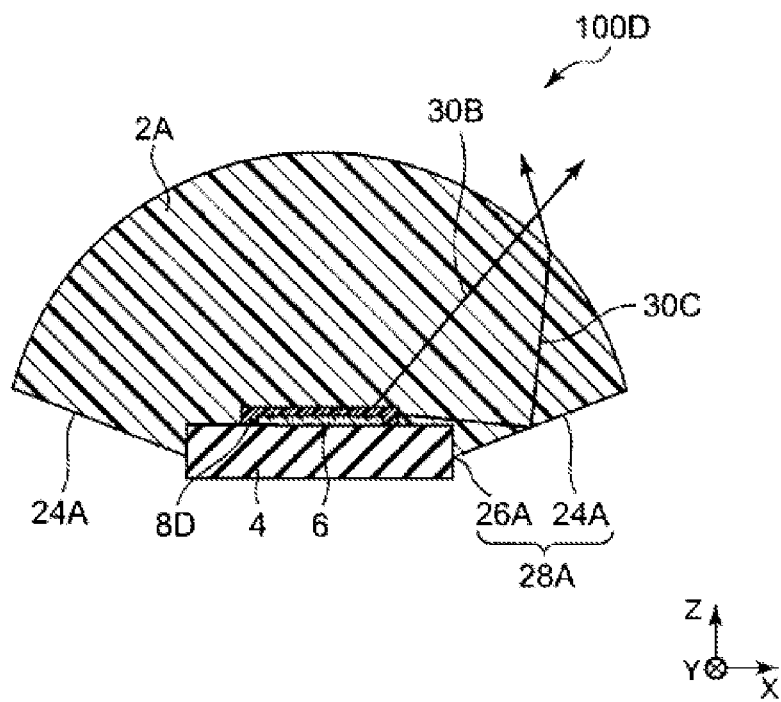

[Fig. 8]
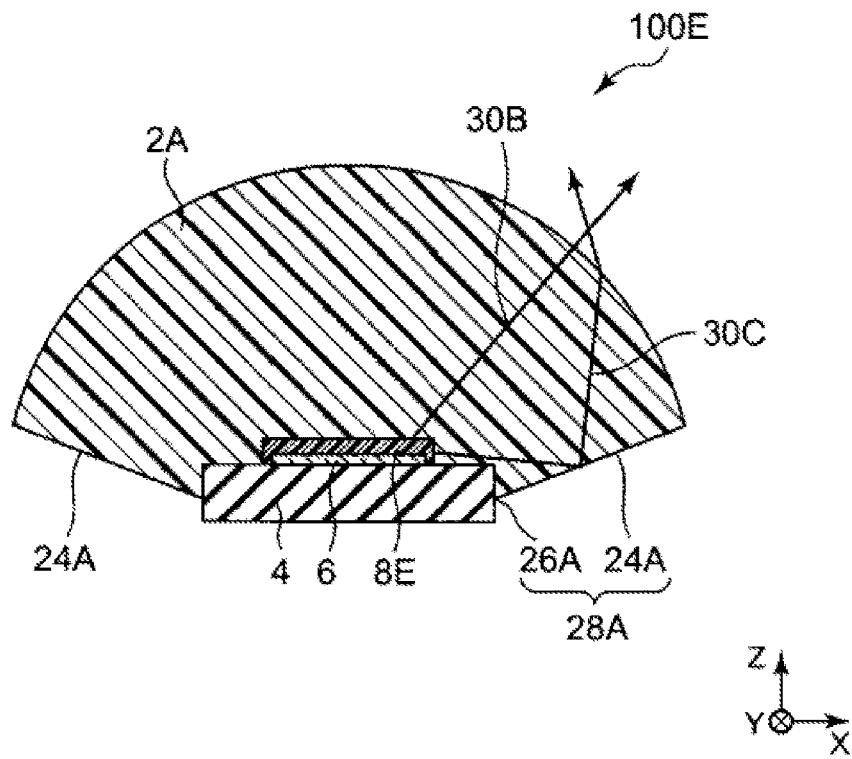
[Fig. 9]
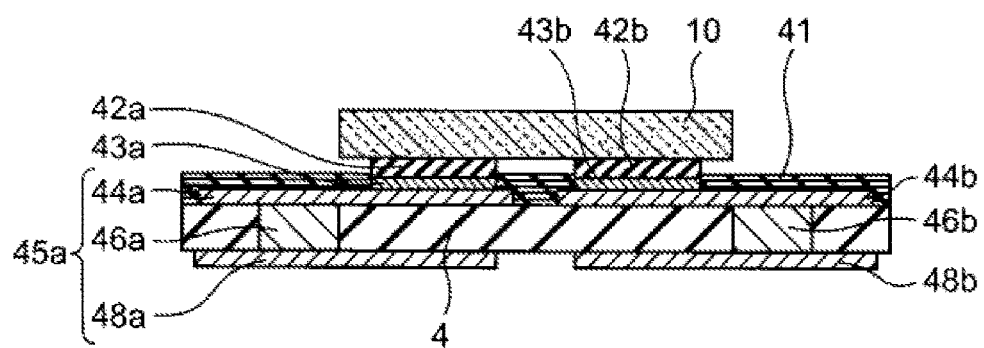

[Fig. 10A]
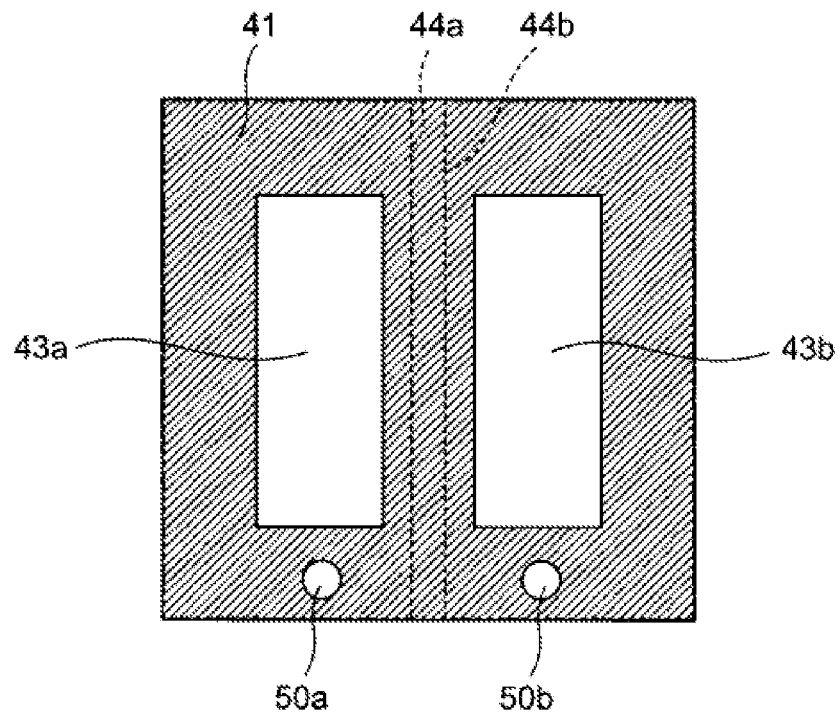
[Fig. 10B]
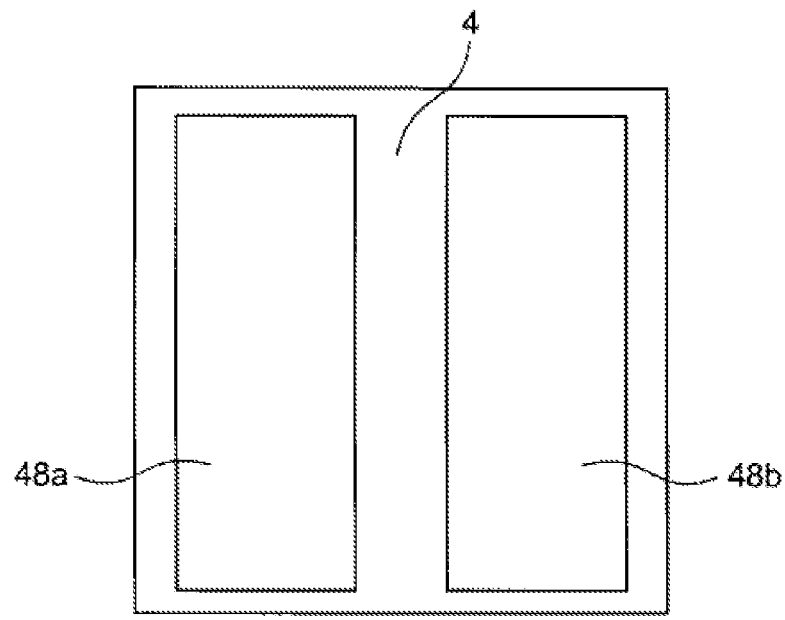

[Fig. 11]
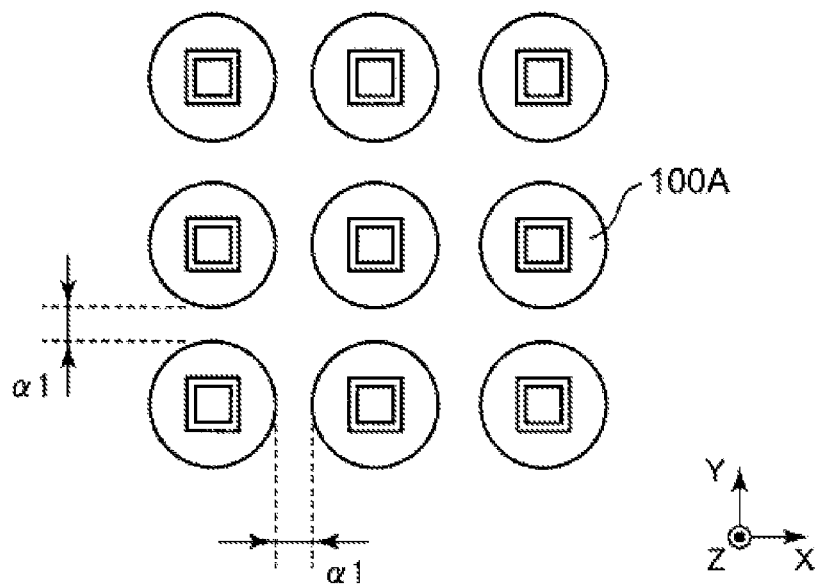
[Fig. 12]
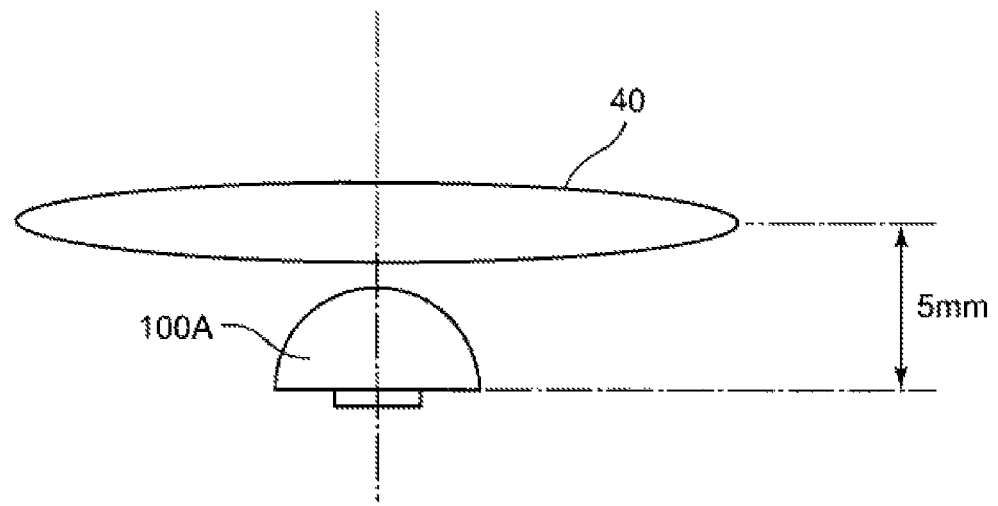

[Fig. 13]
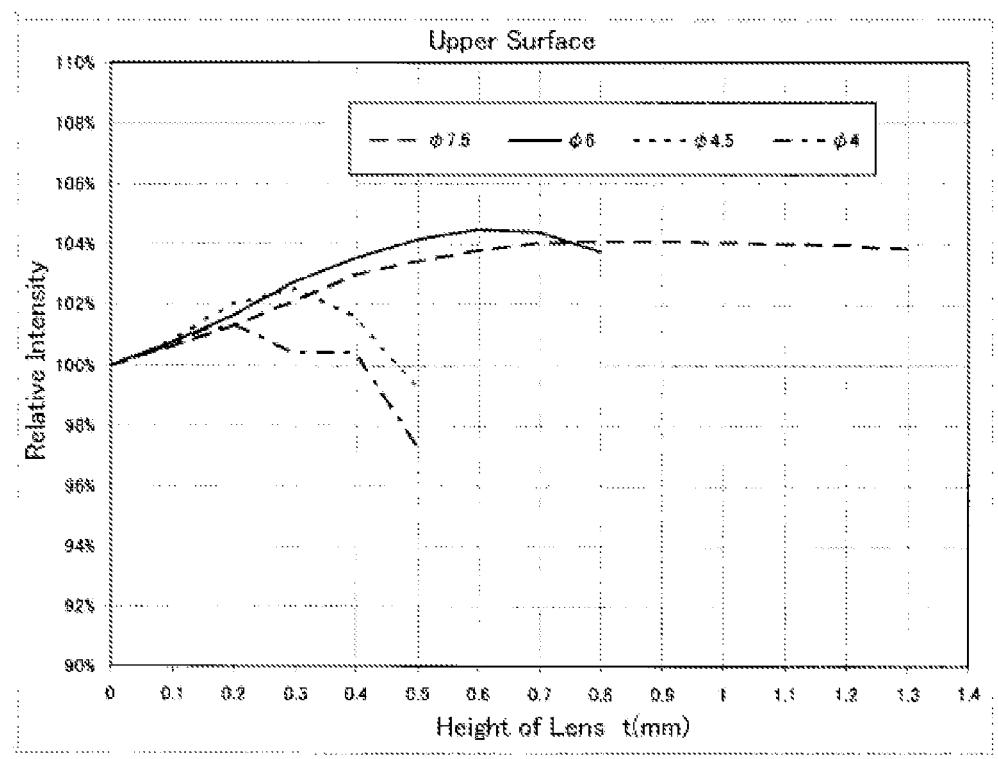

[Fig. 14]
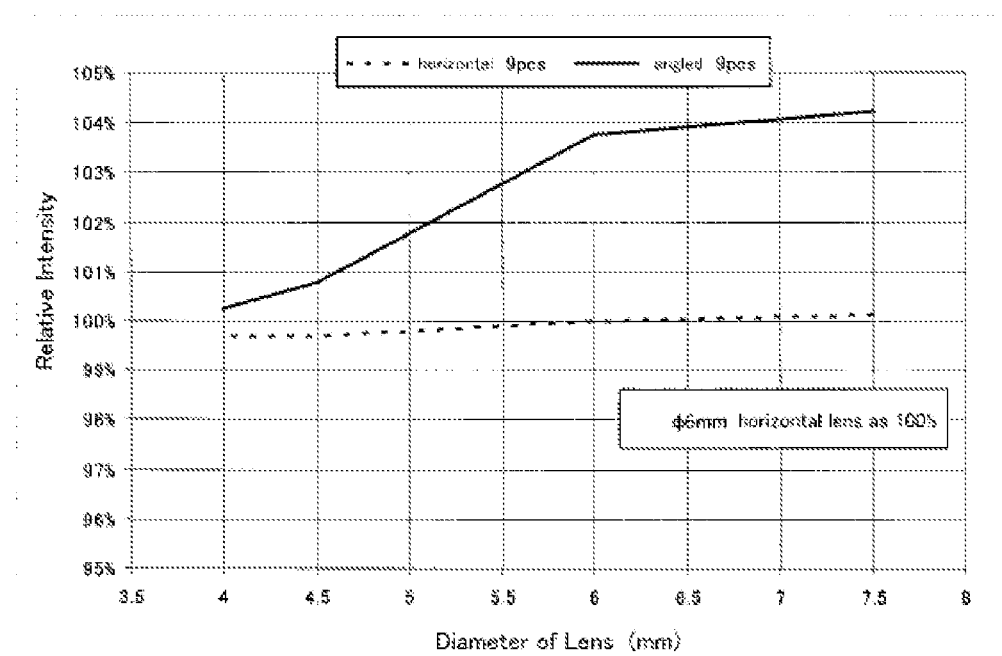

[Fig. 15]
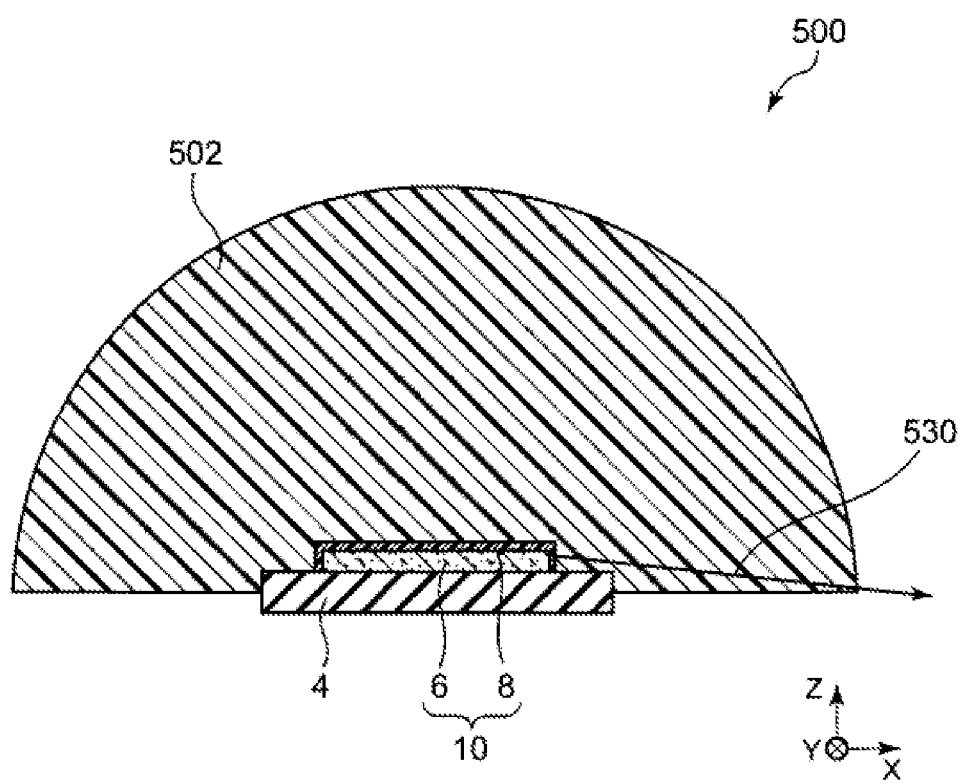

LIGHT EMITTING DEVICE

CROSS-REFERENCE TO RELATED APPLICATIONS

This application claims priority to Japanese Patent Application No. 2013-164212 filed on Aug. 7, 2013. The entire disclosure of Japanese Patent Application No. 2013-164212 is hereby incorporated herein by reference.

BACKGROUND

Field

The disclosure relates to a light emitting device, particularly to a light emitting device with a lens which is arranged to cover a light emitting element.

Description of the Related Art

Light emitting devices that use semiconductor chips (light emitting elements) such as light emitting diodes can be easily reduced in size while obtaining high luminous efficiency and are used widely. Among those, some light emitting devices have, for example, a lens (i.e. a sealing portion which serves as a lens) to refract light from the semiconductor chip in a desired direction, in order to obtain a larger amount of light in a specific direction such as in the upward direction of the substrate. The light emitting devices of this type equipped with a lens are adapted to many applications such as lighting and backlights.

The lens used in such a light emitting device is generally disposed on a substrate so as to cover the light emitting element. A significant amount of light emitted from the light emitting element is refracted by the lens and directed from the upper surface of the lens toward the desired direction. However, with such an arrangement of the lens, most portion of the lower surface of the lens may be in contact with the surface of the substrate. As a result, a part of light emitted from the light emitting element, particularly the light in a downward direction exits the lens and reaches the substrate. This is due to a difference between the refractive index $n_1$ of the light-transmissive material such as glass or a resin which constitutes the lens and the refractive index $n_2$ of the material which constitutes the mounting substrate. That is, in the case where $n_2$ is larger than $n_1$, total reflection does not occur, or in the case where $n_1$ is larger than $n_2$ but the difference between $n_1$ and $n_2$ is too small, the critical angle for total reflection increases.

Accordingly, a part of light reaching the substrate is reflected and returned inside the lens, but significant part of light reaching the substrate is absorbed by the substrate. The absorption of light by the substrate can be reduced by increasing the reflectance of the surface of the substrate. However, even with such a known technique to reduce the absorption, significant amount of the light is absorbed by the substrate, which may result in a decrease of the light extraction efficiency. For this reason, for example, as shown in JP 2010-251666A, there has been known a light emitting device in which a lens (particularly the bottom surface of the lens) is extended to outside of the substrate in a plan view. FIG. 15 is a cross-sectional view schematically showing a cross-section of a known light emitting device 500 in which the bottom surface of the lens is extended to outside of the substrate.

In the light emitting device 500, a light emitting element 10 is mounted on the substrate 4. The light emitting element 10 and the upper surface of the substrate 4 are arranged within the lens 502, and a portion of the substrate 4 is exposed in the bottom surface of the lens 502. Also, the bottom surface of the lens 502 is extended to outside of the substrate 4 in a top view along a direction perpendicular to the upper surface of the substrate 4 (the −Z direction in FIG. 15).

As shown in FIG. 15, of the bottom surface of the lens 502, the portion which is extended to the outside of the substrate 4 is in contact with the air. The air has a small refractive index, so that the difference between the refractive index $n_1$ of the light transmissive material such as glass or a resin which constituting the lens and the refractive index $n_{air}$ of the air can be large and which leads a small value of the critical angle for total reflection. As a result, most of the light reaching the bottom surface of the lens 502 is reflected and thus the amount of light exiting to outside from the bottom surface of the lens 502 can be reduced. With this arrangement, the light emitting device 500 can provide high extraction efficiency, particularly high extraction efficiency from the upper surface of the lens.

In recent years, a light emitting device which has much higher light extraction efficiency, particularly at the upper surface side of the lens than that of a conventional light emitting device has been demanded, and for this, a light emitting device which allows for a further reduction of leakage of light to the mounting surface side (i.e., downward with respect to the bottom surface of the lens) has been demanded.

SUMMARY

Accordingly, it is an object of the disclosure to provide a light emitting device which has a lens, in a plan view, extended to outside of the substrate on which a light emitting element (a semiconductor chip) is mounted, and leakage of light to the mounting surface side is reduced.

A light emitting device according to the embodiments includes a light emitting element, a substrate member having the light emitting element mounted on its upper surface, and a lens enclosing the light emitting element and the upper surface of the substrate member. The lens has a curved upper surface. From the bottom surface of the lens, a lower surface of the substrate member is exposed. In a top view from a perpendicular direction to the upper surface of the substrate member, the bottom surface of the lens includes an outer side-extending portion where the bottom surface is extended to outside of the substrate member, and a inclined portion, which inclines with respect to a direction approximately in parallel to the upper surface of the substrate member, at an end portion of the outer side-extending portion.

A light emitting device according to the embodiments has a structure in a plan view, in which a lens is extended to the outside of a substrate on which a light emitting element (semiconductor chip) is mounted, and leakage of light to the mounting surface side is reduced.

BRIEF DESCRIPTION OF THE DRAWINGS

FIG. 1A is a schematic plan view of a light emitting device 100 according to an embodiment.

FIG. 1B is a schematic cross-sectional view showing a cross section at Ib-Ib in FIG. 1A.

FIG. 2 is a partially enlarged view of A1 shown by broken line in FIG. 1B.

FIG. 3 is a cross-sectional view of a light emitting device 100A which has a lens with a bottom surface according to another embodiment.

FIG. 4 is a partially enlarged view of A2 shown by broken line in FIG. 3.

FIG. 5 is a schematic cross-sectional view of a light emitting device 100B with a lens 2B which produces a batwing luminous distribution profile.

FIG. 6 is a schematic cross-sectional view of a light emitting device 100C which has a lens 2C with a bottom surface which is illustrated by a curved line in a cross-sectional view.

FIG. 7 is a schematic cross sectional view of a light emitting device 100D which has a fluorescent material layer 8 with a thickness greater at the side surface side than at the upper surface side.

FIG. 8 is a schematic cross-sectional view of a light emitting device 100E which has a fluorescent material layer 8 with a thickness greater at the upper surface side than at the side surface side.

FIG. 9 is a schematic cross-sectional view of a light emitting element 10 mounted on a substrate 4 in a favorable manner.

FIG. 10A is a top view of the substrate 4 shown in FIG. 9.

FIG. 10B is a bottom view of the substrate 4 shown in FIG. 9.

FIG. 11 is a schematic plan view showing an arrangement pattern of a plurality of light emitting devices 100A employed in the simulation 2.

FIG. 12 is a schematic diagram showing a range employed to determine the amount of upward light of the light emitting device 100A.

FIG. 13 is a graph showing a result of the simulation 1.

FIG. 14 is a graph showing a result of the simulation 2.

FIG. 15 is a schematic cross sectional view of a known light emitting device 500 in which the bottom surface of the lens is extended to outside of the substrate.

DETAILED DESCRIPTION OF EMBODIMENTS

The embodiments according to the present invention will be described below with reference to the drawings. In the description below, when appropriate, terms which indicate specific directions or locations (for example, "up", "down", "right", "left" and other terms expressing those) may be applied, but those terms are used for easy understanding of the disclosure with reference to the accompanying drawings, and thus the technical scope of the disclosure shall not be limited by the meaning of those terms. The same numerals in different drawings indicate the same or similar portions or members.

As a result of further study, it is found that forming an inclined portion which is inclined with respect to the upper surface of the substrate member at an end portion of the bottom surface of the lens allows for an reduction of leakage of light to the mounting surface side, and which leads to a light emitting device of the disclosure. Referring to the drawings, a light emitting device according to embodiments will be described in detail below.

FIG. 1A is a schematic plan view of a light emitting device 100 according to an embodiment, and FIG. 1B is a schematic cross-sectional view showing a cross section at Ib-Ib in FIG. 1A. The light emitting device 100 includes a substrate 4, a light emitting element 10 mounted on the substrate 4, and a lens 2. The light emitting element 10 includes a semiconductor layer 6, and further may include a fluorescent material layer 8 which covers outer surfaces of the semiconductor layer 6 as needed. The semiconductor layer 6 includes a p-type semiconductor layer and an n-type semiconductor layer, and emits light between the p-type semiconductor layer and the n-type semiconductor layer. The semiconductor layer 6 may have an active layer (a light emitting layer) between p-type semiconductor layer and an n-type semiconductor layer, as needed.

The substrate 4 has a wiring pattern formed on its surface to supply electric power to the light emitting element 10, but the wiring pattern is omitted in FIGS. 1A and 1B (also in FIGS. 2 to 8 to be described below). The wiring pattern of the substrate 4 includes at least two wiring patterns. For example, on the upper surface of the substrate, one of two wiring patterns is electrically connected to the p-type semiconductor layer of the semiconductor layer 6 and the other wiring pattern is electrically connected to the n-type semiconductor layer of the semiconductor layer 6. Each wiring pattern can be electrically connected to respective wirings provided outside of the light emitting device 100. Examples of the wirings provided outside includes a wiring pattern provided on a secondary substrate member (a second substrate member) which is not shown in the drawings. For example, the wiring pattern on the substrate 4 is extended from the upper surface to the lower surface of the substrate 4 with the use of a via and the like and a wiring pattern is formed on the upper surface of the secondary substrate member, lower surface of the substrate 4 is mounted on the upper surface of the secondary substrate member. Thus, the wiring pattern of the mounting substrate 4 and the wiring pattern of the secondary substrate can be electrically connected. With this arrangement, power can be supplied to the light emitting element 10 from an external power source. Preferable examples of the wiring patterns will be described below with reference to FIG. 9 and FIGS. 10A and 10B.

The lens 2 has an upper surface 22 and a lower surface 28. The lower surface 28 encloses the light emitting element 10 and the upper surface of the substrate 4 (i.e. in FIGS. 1A and 1B, a surface of Z-side of the two surfaces in parallel to an X-Y plane of the substrate 4). That is, the light emitting element 10 and the upper surface of the substrate 4 are arranged in the lens 2. Also, the lower surface of the substrate 4 (i.e. in FIGS. 1A and 1B, a surface of the −Z-side of the two surfaces in parallel to a X-Y plane of the substrate 4) is exposed from the bottom surface 28 of the lens 2.

In an embodiment shown in FIG. 1B, the entire light emitting element 10 is arranged in the lens. The substrate 4 is arranged such that the entire upper surface of the substrate 4 is arranged in the lens and the four side surfaces of the substrate 4 are partially arranged in the lens 4. As a result, the lower surface of the substrate 4 is exposed protruding from the bottom surface 28 of the lens 2. With such a structure described above, emission from the light emitting element 10 can be securely introduced in the lens 2. Further, for example, in the case where the lower surface of the substrate 4 is mounted on a flat portion such as the upper surface of the secondary substrate member (that is, in the case where the light emitting device 100 is arranged on a flat portion such as a wide substrate member), a portion of the bottom surface of the lens 2 which is extending to outside of the substrate 4 in a top view (described in detail below) can be securely in contact with the air which has a low refractive index compared to that of the material of the substrate member etc.

The lens 2 is arranged such that, in a top view from a direction perpendicular to the upper surface of the substrate 4 (i.e. the Z-direction), the bottom surface 28 of the lens 2 is extended to outside of the substrate 4 (that is, the bottom surface 28 has an "outer extending portion" which is extended to outside of the substrate 4). As shown in FIGS. 1A and 1B, the substrate 4 can be formed with a lateral length L1 (in the X-direction shown in FIGS. 1A and 1B)

and a longitudinal length (in Y-direction shown in FIGS. 1A and 1B) smaller than the outer diameter $D_{L1}$ of the lens 2 so that the bottom surface 28 of the lens 2 is extended to outside of the entire outer periphery of the substrate 4 (that is, the outer extending portion of the bottom surface 28 of the lens 2 is formed with respect to the entire outer periphery of the substrate 4). The arrangement is not limited to those described above, and for example, either one of the lateral length L1 and the longitudinal direction L2 of the substrate 4 may be larger than the outer diameter $D_{L1}$ of the lens 2 and the other length may be smaller than the outer diameter $D_{L1}$ of the lens 2, so that at a portion of the outer periphery of the substrate 4, the bottom surface 28 of the lens 2 may be extended to the outer side of the substrate 4.

Of the bottom surface 28 of the lens 2, a portion which is extending to outside of the substrate 4 is to be in contact with the air which has a lower refractive index as described above. Thus, this portion has a small critical angle for total reflection, so that significant amount of light which reaches the portion is reflected to propagate within the lens 2A. Accordingly, a high light extraction efficiency can be obtained. It is preferable that the substrate 4 and the light emitting element 10 are arranged, in a top view (for example, as shown in FIG. 1A), at approximately the center of the lens 2. Because with this arrangement, the light exiting from the lens 2 (particularly from the upper surface 22 of the lens 2) can be approximately uniform.

The bottom surface 28 of the lens 2 includes an inclined portion 24 at its end portion (outer peripheral portion of the bottom surface) which is inclined with respect to a direction (e.g. the X-direction in FIG. 1B) approximately in parallel to the upper surface of the substrate 4. In the embodiment shown in FIG. 1B, the bottom surface 28 of the lens 2 includes a horizontal portion 26 which is approximately in parallel to the upper surface of the substrate 4, and an inclined portion 24 which is inclined at an angle α to a direction approximately in parallel to the upper surface of the substrate 4. In this arrangement, the outer peripheral portion (outermost portion) of the lens 2 is higher by the height h1 with respect to the boundary between the bottom surface 28 of the lens 2 and the substrate 4 (in FIG. 1B, the boundary between the substrate 4 and the horizontal portion 26). Generally, h1 has a positive value. That is, in the light emitting device of the embodiments, the inclined portion (for example, the inclined portion 24) generally has a distal end portion (an end portion distal to the substrate 4 in lateral direction) which is arranged higher (in the Z-direction shown in FIG. 1B) than a proximate end portion (an end portion proximate to the substrate 4 in the lateral direction (the X-direction shown in FIG. 1B) which is at an inner side.

As described above, with such an inclined portion 24, light which exits from the boundary portion between the upper surface and the bottom surface with the use of a conventional lens 502 can be reflected at the inclined portion 24 to an upward direction of the lens 2.

The boundary portion between the horizontal portion 26 and the inclined portion 24 is, as shown in FIG. 1B, has a wider angle than an angle between the upper surface of the lens and the bottom surface of the lens of the light emitting device 500 shown in FIG. 15 (an angle between a tangential line to the upper surface of the lens and the bottom surface of the lens in the vicinity of the boundary portion between the upper surface of the lens and the bottom surface of the lens in the light emitting device 500). With this arrangement, the amount of light which leaks to outside from the boundary portion between the horizontal portion 26 and the inclined portion 24 to outside of the lens 2 can be reduced significantly compared to the amount of light which leaks from the boundary between the outer surface and the bottom surface of the lens 502. Accordingly, an effect of improving of the light extraction efficiency (particularly the light extraction efficiency at the upper surface-side of the lens) can be sufficiently obtained.

However, the boundary portion between the inclined portion 24 and the horizontal portion 26 is preferably formed so that light from the light emitting element 10 is not directly incident on the boundary portion. More specifically, as shown in FIG. 1B, the boundary portion between the inclined portion 24 and the horizontal portion 26 is preferably formed proximate side to the substrate 4 than the point of intersection which is determined such that, in a cross sectional plane which includes the center of the substrate 4 and which is perpendicular to the upper surface of the substrate 4, a point of intersection of an imaginary straight line passing an end portion of the upper surface of the light emitting element 10 and an end portion of the upper surface of the substrate which are at the same side (i.e. in FIG. 1B, in the case where the right-side end portion of the light emitting element 10 is selected, the right-side end portion of the upper surface of the substrate 4, and in the case where the left-side end portion of the light emitting element 10 is selected, the left-side end portion of the upper surface of the substrate 4) intersects with the bottom surface 28.

In the specification, the term "angle α1" between the direction approximately in parallel to the upper surface of the substrate 4 and the inclined portion 24 is referred to the angle, in a top view in a direction perpendicular to the upper surface of the substrate 4 (i.e. FIG. 1A), in a cross-section shown in FIG. 1B, the outward straight line in the −X-direction originated from the lens 2 plane which includes the center of the lens 2 and perpendicular to the upper surface of the substrate 4 (i.e. the cross section shown in FIG. 1B), which is determined by a straight line which is approximately in parallel to the upper surface of the substrate 4 and which is toward the outer side from the lens 2 (For the angle α1 at the left side in FIG. 1B, the outward straight line in the −X-direction originated from the lens 2, and for the angle α1 at the right side in FIG. 1B, the outward straight line in the X-direction originated from the lens 2). The angle α1 can be greater than 0° and smaller than 90°. The angle α1 is an angle preferably at which light travelling from the end portion of the upper surface of the light emitting element 10 toward the boundary portion between the inclined portion 24 and the horizontal portion 26 can be totally reflected at the inclined portion 24. In order to have total reflection, the incident angle of light incident on the inclined portion 24 is needed to be equal or greater than the critical angle $\theta_c$ which satisfies the formula (1) shown below.

$$\theta_c = ARC \cdot \sin(n_{air}/n_1) \quad (1)$$

In formula (1), $n_{air}$ is a refractive index of the air and $n_1$ is a refractive index of the material which constitutes the lens 2.

The height $h_1$ is preferably equal or greater than the height from the horizontal portion 26 to the upper surface of the light emitting element 10. This is because with this arrangement, straight light emitted from the light emitting element 10 can be extracted in the upper direction by the horizontal portion 26 and the inclined portion 24. In this preferable embodiment, the boundary between the upper surface 22 of the lens 2 and the inclined portion 24 is located upper than the upper surface of the light emitting element 10.

FIG. 2 is a partially enlarged view of A1 shown by broken line in FIG. 1B. Due to the conditions such as the wettability between the material used for the lens 2 and the material used for the substrate 4, and the molding method of the lens 2, the lens 2 may have a downwardly extending portion 62 at the boundary portion with the substrate 4. The downwardly extending portion 62 as indicated above is a part of the lens 2 which is extended downwardly (in the −Z direction in FIG. 2) along a side surface of the substrate 4, further than the horizontal portion 26.

The downwardly extending portion 62 has a width b (lateral length) b which is small, about 50 μm (for example, 0.2 mm or less). Thus, the presence of the downward projection 62 can be generally disregarded. For example, disregarding the downwardly extending portion 62, an intersection of an extension line of the horizontal portion 26 and a side surface of the substrate 4 may be indicated as the boundary between the substrate 4 and the horizontal portion 26.

In order to further improve the light extraction efficiency, it is preferable that the light which exits from the downwardly extending portion 62 in a downward direction (the −X direction in FIG. 2) of the substrate 4 is also reduced. In order to prevent the light emitted from the light emitting element 10 from being incident on the downwardly extending portion 62, the formula (2) is preferably satisfied.

$$H_{OFF} \geq (b/a) \times H_{EM} \quad (2)$$

In formula (2), $H_{OFF}$ is a height of the horizontal portion 26 of the lens 2 with respect to the upper surface of the substrate 4, $H_{EM}$ is a height of the upper surface of the substrate 4 with respect to the upper surface of the light emitting element 10, b is a width of the downwardly extending portion 62 (lateral length), and a is a lateral distance (the X-direction in FIG. 2) from an end portion of the upper surface of the light emitting element 10 to an end portion of the upper surface of the substrate 4.

In the light emitting device 100 shown in FIG. 1B, of the bottom surface 28 of the lens 2, the portion which is extended to outer side than the substrate 4 includes the horizontal portion 26 and the inclined portion 24 as described above. It should be noted that the configuration of the bottom surface of the lens 2 is not limited to those described above. FIG. 3 is a cross-sectional view of a light emitting device 100A which has a lens with a bottom surface according to another embodiment.

The light emitting device 100A will be described below mainly regarding different portions from the light emitting device 100. Each components of the light emitting device 100A may have a similar structure with respect to the components of the light emitting device 100, which can be referred to the respective components shown in FIG. 3, omitting "A" from the reference numerals. Of the reference numerals assigned to respective components in FIG. 3, the same reference numerals as in FIG. 1B indicate that the components have the same or similar structures as those shown in FIG. 1B respectively. In the light emitting device 100A, the portion of the bottom surface 28A of the lens 2A which is extended to outside of the substrate 4 is formed only with the inclined portion 24A. That is, the inclined portion 24A is formed from the boundary portion 26A between the lens 2A and the side surface of the substrate 4 to the outermost periphery of the lens 2A.

FIG. 4 is a partially enlarged view of portion A2, shown by broken line in FIG. 3B. In a similar manner as the lens 2 of the light emitting device 100, due to the conditions such as the wettability between the material of the lens 2A and the material of the substrate 4, the lens 2A may have a downwardly extending portion 62A at the boundary portion with the substrate 4. In the specification, the term "downwardly extending portion 62A" is referred to a portion of the lens 2 which is extended downwardly (in the −Z direction in FIG. 4) from the inclined portion 24A along a side surface of the substrate 4.

The downwardly extending portion 62A has a width b (lateral length) b which is small, about 50 μm (for example, 0.2 mm or less). Thus, the presence of the downward projection 62 can be generally disregarded. For example, disregarding the downwardly extending portion 62A, an intersection of an extension line of the inclined portion 24A and a side surface of the substrate 4 may be indicated as the boundary portion 26A between the substrate 4 and the inclined portion 24A. In the specification, the expression "inclined portion 24A is formed from the boundary portion 26A between the lens 2A and the substrate 4 to the outermost peripheral portion of the lens 2A" is a concept that includes a case where a downwardly extending portion 62 is formed.

In the embodiment shown in FIG. 3, the inclined portion 24A of the bottom surface 28A of the lens 2A is inclined at an angle α2 to a direction approximately in parallel to the upper surface of the substrate 4. In this arrangement, the outer peripheral portion (outermost portion) of the lens 2A is higher by the height h2 with respect to the boundary 26A between the inclined portion 24A of the lens 2A and the substrate 4.

As described above, with such an inclined portion 24, light which exits from the boundary portion between the upper surface and the bottom surface in a known manner can now be reflected at the inclined portion 24A into an upward direction of the lens 2, as shown by an arrow 30A in FIG. 3.

The term "angle α2" between the direction approximately in parallel to the upper surface of the substrate 4 and the inclined portion 24 is referring to the angle, in a top view in a direction perpendicular to the upper surface of the substrate 4, in a cross-section which includes the center of the lens 2A and perpendicular to the upper surface of the substrate 4 (i.e. the cross-section shown in FIG. 3), the outward straight line which is approximately in parallel to the upper surface of the substrate 4 and which is toward the outer side from the lens 2A in the −X-direction originated from the lens 2 plane, (For the angle α1 at the left side in FIG. 3, the outward straight line in the −X-direction originated from the lens 2A, and for the angle α2 at the right side in FIG. 1B, the outward straight line in the X-direction originated from the lens 2). The angle α2 can be greater than 0° and smaller than 90°.

The angle α2 is preferably equal to or smaller than the angle at which light propagating from an end portion (end side) of the upper surface of the light emitting element 10 (a fluorescent material layer 8 if it is included) toward an end portion (end side) of the substrate 4 can be totally reflected at the inclined portion 24A.

The height h2 of an outer peripheral portion (outermost portion) of the lens 2A with respect to the lowest portion (the boundary portion 26A in FIG. 2) of the bottom surface 28A of the lens 28A is preferably equal to or larger than the height of the boundary portion 26A to the upper surface of the light emitting element 10 (a fluorescent material layer 8, if it is employed). With this arrangement, light emitted from the light emitting element 10 in a downward direction (the −Z-direction in FIG. 3) or in a horizontal direction (the X-direction or the −X-direction) can be totally extracted upward by utilizing total reflection of the light at the interface with the air. In this preferable embodiment, the boundary between the upper surface 22 of the lens 2 and the inclined portion 24 is located upper than the upper surface of the light emitting element 10.

In an embodiment shown in FIG. 3, the center of the lens 2A along the lateral direction (the X-direction) and the center of the substrate 4 along the lateral direction coincide each other, so that the angle α2 and the height h2 satisfy the formula (3) shown below.

$$\tan \alpha 2 = h2/((D_{L2}-L1)/2) \tag{3}$$

In formula (3), $D_{L2}$ indicates the outer diameter of the lens 2A and L1 indicates the lateral length of the mounting substrate.

The light emitting device 100A described above has similar performance characteristics as the light emitting device 100. That is, of the bottom surface 28A of the lens 2A, a portion which is extended to outside of the substrate 4 is to be in contact with the air which has a lower refractive index. Thus, this portion has a small critical angle for total reflection, so that significant amount of light which reaches the portion is reflected to propagate within the lens 2A. Accordingly, a high light extraction efficiency can be obtained. Further, the lens 2A has an inclined portion 24A, which allows for an improvement in the light extraction efficiency, particularly at the upper surface side of the lens.

Moreover, the light emitting device 100 and the light emitting device 100A have the inclined portion 24 and the inclined portion 24A, respectively. This arrangement allows for facilitating confirmation of the state of solder bonding when mounting the substrate 4 on a secondary substrate with the use of a solder. Particularly, visual confirmation of the solder-bonded portion can be easily performed in the light emitting device 100A, where, of the bottom surface of the lens 2A, all portions extended to outside of the substrate 4 are inclined portions 24A.

In some embodiments, such as shown in FIGS. 1A, 1B, and FIG. 3, the lens 2, 2A is spherical lens (hemispherical lens) respectively has a spherical upper surface 22, 22A, but is not limited thereto. The lens in the light emitting device of the embodiments may be a lens in the appropriate shape with a curved upper surface 22, for example, a lens which has a batwing luminous distribution profile or an aspherical lens can be employed. FIG. 5 is a schematic cross sectional view of a light emitting device 100B which has a lens 2B of batwing luminous distribution profile. In some embodiments, such as shown in FIGS. 1A, 1B, and FIG. 3, the lens 2, 2A has a bottom surface 28, 28A which is composed of a straight line in cross-section. But it is not limited thereto, the lens in the light emitting device of the embodiments may have a bottom surface which is composed of a curved line (i.e. includes a curved portion or includes only a curved portion) in cross-section. FIG. 6 is a schematic cross-sectional view of a light emitting device 100C which has a lens 2C with a bottom surface with a curved bottom surface in cross-section. In the light emitting device 100C, the inclined portion 24C at the bottom surface is composed of a continuous curved line in cross section, from the boundary portion with the substrate 4 to the boundary portion with the upper surface 22C of the lens. Further, as seen from FIG. 6, the inclined portion 24 is also arranged so that, the end portion at the outer side (i.e. the end portion which is distal to the substrate 4 in the lateral direction) is located higher (in the Z-direction in FIG. 6) with respect to the end portion at the inner side (i.e. the end portion which is proximate to the substrate 4 in the lateral direction (the X-direction in FIG. 6)).

Next, the operation of the light emitting device 100 will be described. For example, an electric current is supplied to the wiring pattern of the substrate 4 via the wiring pattern on the secondary substrate member. From the wiring pattern of the substrate 4, the current further flows to the p-type semiconductor layer and the n-type semiconductor layer of the light emitting element 10, and the light emitting element 10 emits light. In the case where the fluorescent material layer 8 is employed, apart of emission from the light emitting element 10 is absorbed by the fluorescent material in the fluorescent material layer 8 and converted into light of a longer wavelength.

Of the light from the light emitting element 10 and the light whose wavelength is converted by the fluorescent material in the fluorescent material layer 8 (in the case where the fluorescent material layer 8 is employed), the light which reaches the upper surface 22 of the lens 2 can be refracted in a predetermined direction and exits from the lens 2. Meanwhile, of the light whose wavelength is converted by the fluorescent material in the fluorescent material layer 8 (in the case where the fluorescent material layer 8 is employed), significant amount of the light which reaches the bottom surface 22, particularly significant amount of the light which reaches the horizontal portion 26 and the inclined portion 24 bottom surface 22, can be reflected by the horizontal portion 26 and the inclined portion 24 respectively, and propagates within the lens 2. Upon arriving at the upper surface 22, the light can then be refracted in a predetermined direction and exits from the lens 2. Accordingly, the light emitting device 100 can exhibit a high light extraction efficiency (particularly, at the upper surface side of the lens 2).

The details of each component of the light emitting device 100 will be described below.

Light Emitting Element 10 and Substrate 4

The light emitting element 10 may be, for example, a semiconductor element such as an LED chip. More specific examples of the semiconductor layer 6 include a structure of, from a substrate, such as a sapphire substrate, side, an n-type semiconductor layer, an active layer (light emitting layer), and a p-type semiconductor layer stacked in this order. Examples of the semiconductor to be employed include a GaN-based compound semiconductor, which is an nitride semiconductor. The light emitting element 10 is not limited thereto, and other semiconductor materials may be used, and a protective layer and/or a reflecting layer may be provided when appropriate.

In the case where the light emitting element 10 is, for example, a white light emitting element, as shown in FIGS. 1A, 1B, outer side of a semiconductor layer 6 to emit blue light may be covered with a fluorescent material layer 8 which may be constituted with a fluorescent material or a resin which contains one or more fluorescent materials. Examples of fluorescent material employed for the fluorescent material layer 8 include a YAG-based fluorescent material activated with cerium, a LAG-based fluorescent material activated with cerium, and a silicate-based fluorescent material such as $(Sr, Ba)_2SiO_4$:Eu, and a combination of those.

In some embodiments as shown in FIGS. 1A, 1B, and FIG. 3, the fluorescent material layer 8 has substantially the same thickness at the upper side (a length in the height direction (the Z-direction)) and the side surface sides (a length in the X-direction and the Y-direction). However, it is not limited to those. FIG. 7 is a schematic cross sectional view of a light emitting device 100D which has a fluorescent material layer 8 with a thickness greater at the side surface sides than at the upper surface side. FIG. 8 is a schematic cross sectional view of a light emitting device 100E which has a fluorescent material layer 8 with a thickness greater at the upper surface sides than at the side surface sides.

In the light emitting device 100D, the fluorescent material layer 8 has a thickness which is greater at the side surface sides than the thickness at the upper surface side. Thus, with respect to light emitted from the side surfaces of the fluorescent material layer 8, the light emitted from the upper surface of the fluorescent material layer 8 (for example, an arrow 30B) has a greater ratio of optical component which is emitted from the light emitting element 10 and whose wavelength is not converted by the fluorescent material layer 8. However, as illustrated by the arrows 30B, 30C in FIG. 7, the light exited from the upper surface of the fluorescent material layer 8 and the light exited from the side surfaces of the fluorescent material layer 8 are mixed outside of the upper surface of the lens 2A, so that the difference in the ratio as described above may be reduced. Similarly, in the light emitting device 100E, the fluorescent material layer 8 has a thickness greater at the upper surface side than thickness at the side surface sides. Thus, compared to the light emitted from the side surfaces of the fluorescent material layer 8, the light emitted from the upper surface of the fluorescent material layer 8 (for example an arrow 30B) has a greater ratio of optical component which is emitted from the light emitting element 10 and whose wavelength is converted by the fluorescent material layer 8. However, as illustrated by the arrows 30B, 30C in FIG. 8, the light exited from the upper surface of the fluorescent material layer 8 and the light exited from the side surfaces of the fluorescent material layer 8 are mixed outside of the upper surface 22A of the lens 2A, so that the difference in the ratio as described above may be reduced.

For the substrate 4, for example, ceramics such as aluminum nitride and alumina, and a resin may be employed. The substrate 4 may have a wiring pattern on the upper surface and the lower surface. The metal layer used for the wiring pattern preferably has good electric conductive properties and a high reflectance to the wavelength of light emitted from the light emitting element 10. For example, in order to secure the electric conductive properties, a wiring pattern is formed with the use of, for example, Ti/Pt/Au, and in order to improve the reflectance, a single layer or a multi-layer which contains Ag, Al, Rh, etc., may further be provided on the surface. The substrate 4 may contain a via to electrically connect the wiring pattern of the upper surface and the wiring pattern of the lower surface of the mounting substrate 4. The via may be formed by way of copper plating. The light emitting element 10 may be mounted on the substrate 4 by way of, for example, flip-chip mounting.

FIG. 9 is a schematic cross-sectional view of a light emitting element 10 mounted on a substrate 4 in a favorable manner. FIG. 10A is a top view of the substrate 4 shown in FIG. 9, and FIG. 10B is a bottom view of the substrate 4 shown in FIG. 9. In FIG. 10A, the light emitting element 10 and the bump 42a, 42b are not shown. In some embodiments shown in FIG. 9 and FIGS. 10A, 10B, the substrate 4 includes a upper surface wiring pattern 44a, 44b on the upper surface and a lower surface wiring pattern 48a, 48b on the lower surface. The upper surface wiring pattern 44a and the lower surface wiring pattern 48a are electrically connected through the via 46a (that is, the p-side wiring pattern 45a is formed by the upper surface wiring pattern 44a, the via 46a, and the lower surface wiring pattern 48a). The upper surface wiring pattern 44b and the lower surface wiring pattern 48b are electrically connected through the via 46b (that is, the n-side wiring pattern 45b is formed by the upper surface wiring pattern 44b, the via 46b, and the lower surface wiring pattern 48b). The p-side electrode of the light emitting element 10 which is electrically connected to the p-type semiconductor layer is electrically connected to the bump 42a. The n-side electrode of the light emitting element 10 which is electrically connected to the n-type semiconductor layer is electrically connected to the bump 42b. Further, the pad 43a for eutectic and bump 42a disposed on the upper surface of the upper surface wiring pattern 44a are electrically connected with the use of, for example, an eutectic alloy. Similarly, the pad 43b for eutectic and bump 42b disposed on the upper surface of the upper surface wiring pattern 44b are electrically connected with the use of, for example, an eutectic alloy. Further, the light emitting device 100 is mounted on the secondary substrate and the lower surface wiring patterns 48a, 48b are respectively electrically connected to corresponding wiring patterns of the secondary substrate member. Thus, electric power can be supplied to the light emitting element 10. Preferable examples of the materials for the wiring patterns include Cu/Ni/Au (a stacked layer structure). Preferable examples of the materials for the bump include AuSn (an Au—Sn alloy), and preferable examples of the materials for the pad for eutectic include Ti/Pt/Au (a stacked layer structure).

The upper surface of the substrate 4 is covered with a reflecting layer 41. That is, of the upper surface of the substrate 4, the portions respectively provided with the upper surface wiring patterns 44a, 44b are further provided with a reflecting layer 41 except for the portions where the pads for eutectic 42a, 42b are formed, and on the portions where the upper surface wiring patterns 44a, 44b are not provided, the reflecting layer 41 is formed directly on the substrate 4. The reflecting layer 41 is preferably a multilayer, more preferably a multilayer which serves as a distributed Bragg reflector (DBR). Examples of the multilayer which serves as a distributed Bragg reflector (DBR) include a structure in which a $SiO_2$ layer and a $Nb_2O_5$ film are alternately stacked. Disposing such a reflecting layer 41 allows for reflecting light which is emitted from the light emitting element 10 toward the substrate 4, to securely guide the light within the lens 2. Thus, the light extraction efficiency can be further increased.

On the substrate 4, as shown in FIG. 10A, the pads 50a, 50b for protective element may be disposed. For example, a wire is connected to the pad 50a for protective element and a Zener diode is mounted on the pad 50b for protective element. In this case, the pad 50b for protective element may have a diameter (or planar dimension) greater than the diameter (or planar dimension) of the pad 50a for protective element. In the case where the pads 50a, 50b for protective element are disposed, the reflective layer 41 is not formed on the upper surface of the pads 50a, 50b for protective element.

The light emitting element 10 can be mounted on the substrate 4 by using any appropriate method. For example, the surface of the electrodes are respectively connected to the mounting surface-side of the mounting substrate, an underfill material such as a resin is disposed on the side surfaces of the light emitting element, then, the growth substrate of the light emitting element is removed. Further, a light emitting element which has a fluorescent material layer disposed around the semiconductor layer may be used.

Lens 2

The lens 2 can be made of any appropriate material which has light transmissive property to the light emitted by the light emitting element 10 and the light emitted by the fluorescent material layer 8 (in the case where the fluorescent material layer 8 is employed). For example, the lens 2 can be made of a light transmissive resin or glass. Examples of such a resin include a hard silicone resin and an epoxy resin.

The light emitting device 100 can be manufactured by using any appropriate method such as a method known for manufacturing a known light emitting device 500 described in JP 2010-251666A. The inclined portion 24 of the light emitting device 100 and the inclined portion 24A of the light emitting device 100A can be made by providing a protruding portion which is in conformity to the inclined portion 24 or the inclined portion 24A to the mold for forming the lens 2 or the lens 2A, respectively.

Next, as an effect of the invention, the result of simulations on the light extraction efficiency will be illustrated below.

(1) Simulation 1

FIG. 12 is a schematic diagram showing a range employed to determine the amount of upward light of the light emitting device 100A. The light quantity within a circle 40 of 200 mm in diameter which is assumed located directly above the light emitting device 100A which is at the center of the nine light emitting devices 100A shown in FIG. 12, and is located 5 mm higher than the bottom surface of the lens 2, and is in parallel to the upper surface of the substrate 4, was obtained by the simulation 2. In the simulation, four diameters: 4 mm, 4.5 mm, 6 mm, and 7.5 mm were respectively used as the outer diameter ($D_{L2}$ shown in FIG. 2) of the lens 2A, and the longitudinal length and the lateral length of the substrate 4 were set to 2.5 mm, the longitudinal length and the lateral length of the light emitting element 10 were set to 1.4 mm, and a fluorescent material layer 8 was disposed on the outer periphery of the light emitting element with a thickness of 15 μm. Then, the height h2 was changed in a range of 0 to 0.5 mm for the lenses with the outer diameter of 4 mm and 4.5 mm, in a range of 0 to 0.8 mm for the lens with the outer diameter of 6 mm, and in a range of 0 to 1.3 mm for the lens with the outer diameter of 7.5 mm. The height h2 of 0 mm corresponds to the known light emitting device 500. The simulation was performed using a commercial software LightTools™. The simulation modeling was designed with the wavelength of the light source (the emission wavelength of the light emitting element 10) of 450 nm, and applying a Mie scattering model to the fluorescent material layer 8. The refractive index of a phenyl-based silicone resin was applied as the refractive index of the lens, and for the reflectance of the substrate 4, 99.8% at the DBR portion and 0% at other portions were applied (as for the DBR portion, see FIG. 9 and FIG. 10A). The light emitting element 10 was constituted with GaN-based semiconductor layers stacked on a sapphire substrate and a thickness of 140 μm for the sapphire and a thickness of 10 μm for the stacked semiconductor layer were respectively applied. For each outer diameter of the lens, 100% was applied for the light quantity at h2=0, and a relative light quantity was determined.

FIG. 13 is a graph showing a result of the simulation 1. The "lens height t" on the axis of abscissa indicates h2. The axis of ordinate indicates relative light quantities. As seen from FIG. 13, the lenses with an outer diameters of 6 mm and 7.5 mm, the relative light amount exceeds 100% in all regions where the height h2 is greater than 0. The lenses with an outer diameter of 4.5 mm, the relative light amount exceeds 100% in a region of up to about 0.45 mm in height h2. The lenses with an outer diameter of 4 mm, the relative light amount exceeds 100% in a region of up to about 0.41 mm in height h2. The results indicates that in addition to sufficiently achieves equivalent level in the light extraction efficiency as in the known light emitting device 500, as determined, the light emitting device 100A according to the embodiments can further obtain higher light extracting efficiency than that in the known light emitting device 500 in a wider region.

(2) Simulation 2

FIG. 11 is a schematic plan view showing an arrangement pattern of a plurality of light emitting devices 100A employed in simulation 2. As shown in FIG. 11, nine light emitting devices A are arranged with a distance d of 1 mm with respective adjacent light emitting devices 100A in both longitudinal direction and lateral direction. As the arrangement patterns, four values, 4 mm, 4.5 mm, 6 mm, and 7.5 mm, are respectively set as the outer diameter ($D_{L2}$ in FIG. 2) of the lens 2A, and each light emitting device is provided with the substrate 4 having a longitudinal direction and the lateral direction of 2.5 mm, the light emitting element 10 having a longitudinal direction and the lateral direction of 1.4 mm, and the fluorescent material layer 8 on the outer periphery of the light emitting element 10. The height h2 is set to 0.1 mm for the outer diameter of the lens of 4 mm, 0.2 mm for the outer diameter of the lens of 4.5 mm, 0.6 mm for the outer diameter of the lens of 6 mm, and 0.8 mm for the outer diameter of the lens of 7.5 mm. Further, for each outer diameter of the lens, the light quantity at h2 of 0 mm (corresponds to the known light emitting device 500) was also obtained for comparison. The light quantity within a circle of 200 mm in diameter which is assumed located directly above the light emitting device 100A which is at the center of the nine light emitting devices 100A shown in FIG. 11, and is located 5 mm higher than the bottom surface of the lens 2, and is in parallel to the upper surface of the substrate 4, was obtained by the simulation 2.

FIG. 14 is a graph showing a result of the simulation 2. As indicated in FIG. 14, the term "horizontal" indicates that the height h2 is substantially 0 mm, and the term "angled" indicates that the height h2 is in a range of 0.1 to 0.8 mm (i.e., corresponds to the embodiments) as described above. The relative light quantities indicated in the axis of ordinate are shown with a value corresponding to h2 of 0 mm and the outer diameter of the lens of 6 mm is set to 100%. As shown in FIG. 14, the light emitting device 100A can achieve a light extraction efficiency higher than that of conventional light emitting devices when arranged plural. As described above, it should be obvious that various other embodiments are possible without departing the spirit and scope of the present invention. Accordingly, the scope and spirit of the present invention should be limited only by the following claims.

What is claimed is:

1. A light emitting device, comprising:
    a light emitting element;
    a substrate having the light emitting element mounted on an upper surface; and
    a lens directly sealing the light emitting element and the upper surface of the substrate, wherein the lens has a curved upper surface, and the lens is formed integrally with the substrate,
    wherein a bottom surface of the lens comprises an outer side-extending portion where the bottom surface is extended to outside of the substrate, the outer side-extending portion comprises an inclined portion, which inclines with respect to a direction approximately in parallel to the upper surface of the substrate, and the outer side-extending portion is in contact with air,
    wherein the outer side-extending portion has a horizontal portion which is approximately in parallel to a surface of the substrate, and wherein, in a cross-section including a center of the substrate, the cross-section being approximately perpendicular to the upper surface of the substrate, a first boundary point between the horizontal portion of the bottom surface of the lens and the inclined portion of the lens is located more proximate to the substrate as compared to an intersection point, wherein the intersection point corresponds to a point where an imaginary straight line intersects with the bottom surface of the lens, and the imaginary straight line corresponds to a line that passes through an end portion of the upper surface of the light emitting element and an end portion of the upper surface of the substrate, and wherein a second boundary point between the curved upper surface of the lens and the inclined portion of the lens is arranged higher than an upper surface of the light emitting element.

2. The light emitting device according to claim 1, wherein the outer side-extending portion is formed on an entire outer periphery of the substrate.

3. The light emitting device according to claim 1, wherein the upper surface of the substrate is covered with a multilayer reflecting layer.

4. The light emitting device according to claim 3, wherein the reflecting layer comprises a Bragg reflector.

5. The light emitting device according to claim 1, wherein the light emitting element includes a fluorescent material layer having a thickness at a side surface side of the fluorescent material layer which is greater than a thickness at an upper surface side of the fluorescent material layer.

6. The light emitting device according to claim 1, wherein the substrate is a flat-shape plate with a wiring pattern on the upper surface and the lower surface.

7. The light emitting device according to claim 1, wherein the substrate is selected from the group consisting of aluminum nitride, alumina, and a resin.

8. The light emitting device according to claim 1, wherein an incident angle of light incident on the inclined portion is equal or greater than a critical angle θc which satisfies the formula (1) shown below $$\theta c = ARC \cdot \sin(n_{air}/n_1) \quad (1).$$

9. A light emitting device, comprising:
a light emitting element;
a substrate having the light emitting element mounted on an upper surface; and
a lens directly sealing the light emitting element and the upper surface of the substrate, wherein a bottom surface of the lens comprises an outer side-extending portion where the bottom surface is extended to outside of the substrate, the outer side-extending portion is in contact with air, and the lens is formed integrally with the substrate;

the outer side-extending portion comprises an inclined portion, which inclines with respect to a direction approximately in parallel to the upper surface of the substrate; and an interface between the outer side-extending portion and a side surface of the substrate is disposed under the upper surface of the substrate, wherein the outer side-extending portion has a horizontal portion which is approximately in parallel to a surface of the substrate, and wherein, in a cross-section including a center of the substrate, the cross-section being approximately perpendicular to the upper surface of the substrate, a first boundary point between the horizontal portion of the bottom surface of the lens and the inclined portion of the lens is located more proximate to the substrate as compared to an intersection point, wherein the intersection point corresponds to a point where an imaginary straight line intersects with the bottom surface of the lens, and the imaginary straight line corresponds to a line that passes through an end portion of the upper surface of the light emitting element and an end portion of the upper surface of the substrate, and wherein a second boundary point between the curved upper surface of the lens and the inclined portion of the lens is arranged higher than an upper surface of the light emitting element.

10. The light emitting device according to claim 9, wherein the outer side-extending portion is formed on an entire outer periphery of the substrate.

11. The light emitting device according to claim 9, wherein the upper surface of the substrate is covered with a multilayer reflecting layer.

12. The light emitting device according to claim 11, wherein the reflecting layer comprises a Bragg reflector.

* * * * *